United States Patent
Simonnet et al.

(10) Patent No.: US 10,148,810 B2
(45) Date of Patent: Dec. 4, 2018

(54) PROTECTION OF A TELEPHONE LINE AGAINST OVERVOLTAGES

(71) Applicant: STMicroelectronics (Tours) SAS, Tours (FR)

(72) Inventors: Jean-Michel Simonnet, Veretz (FR); Christian Ballon, Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 275 days.

(21) Appl. No.: 15/045,935

(22) Filed: Feb. 17, 2016

(65) Prior Publication Data

US 2017/0019526 A1  Jan. 19, 2017

(30) Foreign Application Priority Data

Jul. 13, 2015 (FR) ...................................... 15 56647

(51) Int. Cl.
| | |
|---|---|
| *H04M 1/74* | (2006.01) |
| *H01L 27/02* | (2006.01) |
| *H02H 9/04* | (2006.01) |
| *H04M 3/18* | (2006.01) |
| *H04M 3/00* | (2006.01) |
| *H04M 19/08* | (2006.01) |

(52) U.S. Cl.
CPC ........ *H04M 1/745* (2013.01); *H01L 27/0248* (2013.01); *H02H 9/041* (2013.01); *H02H 9/043* (2013.01); *H04M 3/005* (2013.01); *H04M 3/18* (2013.01); *H04M 19/08* (2013.01); *H04M 2201/80* (2013.01)

(58) Field of Classification Search
CPC ...................................................... H04N 1/745
USPC ....... 257/107, 119, 146, 173, 360, 601, 175, 257/177; 361/56, 91.5, 119, 57, 86, 118, 361/13, 111; 363/54, 163; 379/412; 438/140; 327/438, 463; 370/271
See application file for complete search history.

(56) References Cited

U.S. PATENT DOCUMENTS

| | | | | |
|---|---|---|---|---|
| 4,084,207 A | * | 4/1978 | Piccone | H03K 17/0824 361/56 |
| 4,171,532 A | * | 10/1979 | Sloan | H01H 9/542 361/109 |

(Continued)

FOREIGN PATENT DOCUMENTS

| | | |
|---|---|---|
| FR | 2773265 A1 | 7/1999 |
| WO | WO-8202287 A1 | 7/1982 |
| WO | WO-03036773 A2 | 5/2003 |

OTHER PUBLICATIONS

INPI Search Report and Written Opinion for FR 1556647 dated May 10, 2016 (9 pages).

(Continued)

*Primary Examiner* — Gerald Gauthier
(74) *Attorney, Agent, or Firm* — Crowe & Dunlevy

(57) ABSTRACT

A structure protects a SLIC telephone line interface against overvoltages lower than a negative threshold or higher than a positive threshold. The structure includes at least one thyristor connected between each conductor of the telephone line and a reference potential. For all of the included thyristors, a metallization corresponding to the main electrode on the gate side is in contact, by its entire surface, with a corresponding semiconductor region. Furthermore, the gate of each thyristor is directly connected to a voltage source defining one of the thresholds.

11 Claims, 3 Drawing Sheets

(56) References Cited

U.S. PATENT DOCUMENTS

| | | | | |
|---|---|---|---|---|
| 4,280,022 A * | 7/1981 | Sekiguchi | H04M 9/007 | 370/271 |
| 4,748,533 A * | 5/1988 | Hertrich | H01L 27/0705 | 257/E27.029 |
| 4,757,341 A * | 7/1988 | Tanigawa | H03K 17/0824 | 307/652 |
| 4,949,147 A * | 8/1990 | Bacuvier | H01L 29/7428 | 257/127 |
| 5,003,588 A * | 3/1991 | Wingerath | H02H 9/041 | 361/119 |
| 5,274,524 A * | 12/1993 | Pezzani | H04M 3/18 | 361/111 |
| 5,537,287 A * | 7/1996 | Dreier | H04M 3/18 | 361/119 |
| 5,796,599 A * | 8/1998 | Raonic | H02M 5/2573 | 327/441 |
| 6,407,901 B1 * | 6/2002 | Casey | H01L 29/747 | 257/E29.215 |
| 6,426,666 B1 * | 7/2002 | Li | H03K 17/0403 | 327/438 |
| 6,479,841 B1 * | 11/2002 | Simonnet | H01L 29/7404 | 257/146 |
| 6,583,496 B2 * | 6/2003 | Galtie | H01L 21/761 | 257/107 |
| 6,775,121 B1 * | 8/2004 | Chaudhry | H02H 9/042 | 361/111 |
| 6,870,202 B2 * | 3/2005 | Oka | H01L 27/0251 | 257/107 |
| 6,914,271 B2 * | 7/2005 | Menard | H01L 29/747 | 257/119 |
| 6,927,427 B2 * | 8/2005 | Ladiray | H01L 27/0817 | 257/107 |
| 6,933,541 B1 * | 8/2005 | Huang | H01L 24/72 | 257/133 |
| 7,019,338 B1 * | 3/2006 | Ballon | H01L 27/0248 | 257/173 |
| 8,664,690 B1 * | 3/2014 | Chen | H01L 27/0262 | 257/107 |
| 8,687,329 B2 | 4/2014 | Appere et al. | | |
| 2001/0002870 A1 * | 6/2001 | Pezzani | H01L 21/761 | 361/91.5 |
| 2004/0169985 A1 * | 9/2004 | Gropl | H01L 27/0262 | 361/119 |
| 2004/0212939 A1 * | 10/2004 | Casey | H01L 29/7408 | 361/57 |
| 2004/0233691 A1 * | 11/2004 | Caldera | H02H 9/041 | 363/163 |
| 2008/0044955 A1 * | 2/2008 | Salcedo | H01L 27/0262 | 438/140 |
| 2008/0137258 A1 * | 6/2008 | Linder | H04M 3/18 | 361/119 |
| 2009/0231768 A1 * | 9/2009 | Speyer | H04M 3/18 | 361/86 |
| 2009/0296300 A1 * | 12/2009 | Casey | H01L 27/0248 | 361/119 |
| 2011/0042747 A1 * | 2/2011 | Galy | H01L 27/0262 | 257/360 |
| 2013/0321970 A1 * | 12/2013 | Miller | H02H 3/20 | 361/118 |
| 2017/0019526 A1 * | 1/2017 | Simonnet | H01L 27/0248 | |

OTHER PUBLICATIONS

First Office Action and Search Report from co-pending CN Appl. No. 201610113619.2 (7 pages).

* cited by examiner

PROTECTION OF A TELEPHONE LINE AGAINST OVERVOLTAGES

PRIORITY CLAIM

This application claims the priority benefit of French Application for Patent No. 1556647, filed on Jul. 13, 2015, the contents of which is hereby incorporated by reference in its entirety to the maximum extent allowable by law.

TECHNICAL FIELD

The present disclosure relates to a structure for protecting an electronic circuit connected to a telephone line against overvoltages, for example due to lightning.

BACKGROUND

FIG. 1 shows a structure of protection of an electronic circuit connected to a telephone line corresponding to FIG. 2 of U.S. Pat. No. 8,687,329 (incorporated by reference). An electronic telephone signal transmit and receive circuit 1, or SLIC ("Subscriber Line Interface Circuit") is connected to a telephone line formed of two conductors 3 and 5, at voltages $V_{TIP}$ and $V_{RING}$. Abrupt overvoltages, for example due to lightning, may occur on conductors 3 and 5 and may damage circuit 1. Conductors 3, 5 are connected to a protection structure 7 capable, when the voltage on one of the conductors comes out of an interval defined by two threshold voltages, of discharging the overvoltage towards a ground 9. The voltage thresholds are defined by power supply voltage sources 11 of positive potential $V_H$ and 13 of negative potential $V_L$. Protection structure 7 comprises two cathode-gate thyristors 15 and 17 having their cathodes respectively connected to conductors 3 and 5, and having grounded anodes. The gates of thyristors 15 and 17 are respectively connected to the emitters of two transistors 19 and 21 of NPN type, having their collectors connected to ground 9 and their bases connected to power supply source 13 of negative potential $V_L$. Protection structure 7 also comprises two anode-gate thyristors 23 and 25 having their anodes respectively connected to conductors 3 and 5 and having their cathodes connected to ground 9. The gates of thyristors 23 and 25 are respectively connected to the emitters of two PNP-type transistors 27 and 29, having their collectors connected to ground 9 and their bases connected to power supply source 11 of positive potential $V_H$.

In normal operation, the voltages of conductors 3 and 5 remain between $V_L$ and $V_H$. All transistors are off, as well as all thyristors.

In case of a negative overvoltage on conductor 3, lower than negative potential $V_L$, the potential of the base of transistor 19 becomes greater than the potential of its emitter, and transistor 19 turns on, which turns on thyristor 15. All along the overvoltage on the line, thyristor 15 remains on and discharges the overvoltage towards ground 9.

In the case of a negative overvoltage lower than negative potential $V_L$ on line 5, the operation is the same as that described for the case of a negative overvoltage on line 3, and implies thyristor 17 and transistor 21.

Similarly, in the case of a positive overvoltage higher than positive potential $V_H$ appearing on line 3 or 5, the operation is similar to the case of a negative overvoltage. A positive overvoltage on line 3 implies anode-gate thyristor 23 and PNP transistor 27. A positive overvoltage on line 5 implies anode-gate thyristor 25 and PNP transistor 29.

After the end of an overvoltage, the implied thyristor only turns off when the current flowing therethrough becomes lower than its hold current. The hold current of the thyristors should thus be higher than the maximum current capable of flowing through the telephone line. The maximum current is, for example, in the order of 150 mA. To obtain high hold currents, the thyristors are provided with emitter short-circuits, such as for example described in U.S. Pat. No. 5,274,524 (incorporated by reference).

A disadvantage of emitter short-circuit thyristors is that they have a low sensitivity, that is, they require a high gate current to turn on. Further in the absence of overvoltage, no current should be able to flow between the protection structure and the conductors of the telephone line, which have voltages in the range from $V_L$ to $V_H$. Now, in each of the thyristors, the presence of emitter short-circuits enables a current to flow between the gate and the conductor of the telephone line connected to the thyristor.

Accordingly, a transistor is provided so that the junction between the emitter and the base of the transistor blocks the flowing of a current in the absence of an overvoltage. This transistor is also used to amplify the current supplied by the power supply sources of potentials $V_L$ and $V_H$ to reach the gate current necessary to turn on the thyristors.

SUMMARY

It is here desired to provide a structure for protecting a telephone line interface against overvoltages, at least partially overcoming some of the disadvantages of existing solutions.

Thus, an embodiment provides a structure for protecting a SLIC telephone line interface against overvoltages lower than a negative threshold or higher than a positive threshold, comprising at least one thyristor connected between each conductor of the telephone line and a reference potential, wherein, for all thyristors, a metallization corresponding to the main electrode on the gate side is in contact, by its entire surface, with a corresponding semiconductor region; and the gate is directly connected to a voltage source defining one of said thresholds.

According to an embodiment, adapted to the case where the positive threshold is zero, each conductor of the telephone line is coupled to the anode of a diode and to the cathode of a cathode-gate thyristor, the cathodes of the diodes and the anodes of the thyristors being coupled to the reference potential; a common negative voltage source being connected to the two gates of the two thyristors.

According to an embodiment, each line is connected to the cathode of a cathode-gate thyristor and to the anode of an anode-gate thyristor, the anodes of the cathode-gate thyristors and the cathodes of the anode-gate thyristors being coupled to the reference potential; the gates of the cathode-gate thyristors being directly connected to a common negative voltage source defining the negative threshold; and the gates of the anode-gate thyristors being directly connected to a common positive voltage source defining the positive threshold.

According to an embodiment, the thyristors and the diodes are formed in a same monolithic component.

According to an embodiment, all thyristors are formed in a same monolithic component.

According to an embodiment, one at least of the voltage sources is a power supply source of the SLIC.

According to an embodiment, one at least of the voltage sources comprises at least one battery.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1:
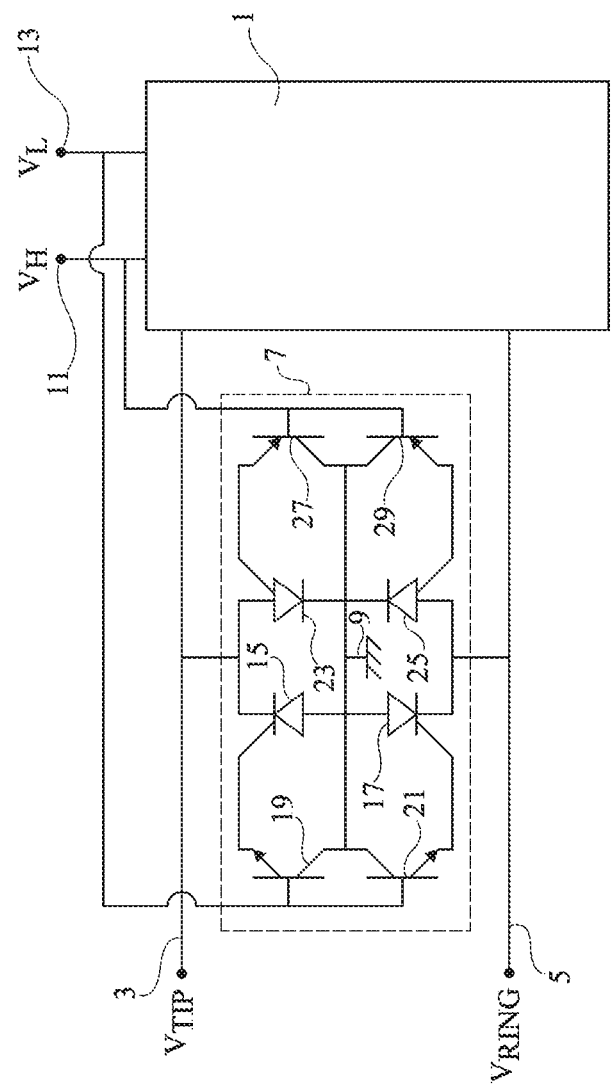
FIG. 1, previously described, shows a circuit of protection against overvoltages lower than a negative threshold or higher than a positive threshold, connected to a telephone line.

The same elements have been designated with the same reference numerals in the different drawings and, further, the various drawings are not to scale. For clarity, only those elements which are useful to the understanding of the described embodiments have been shown and are detailed.

In the following description, when reference is made to terms qualifying absolute positions, such as terms "high", "low", "left-hand", "right-hand", reference is made to the orientation of the drawings in a normal position of use.

Figure 2A:
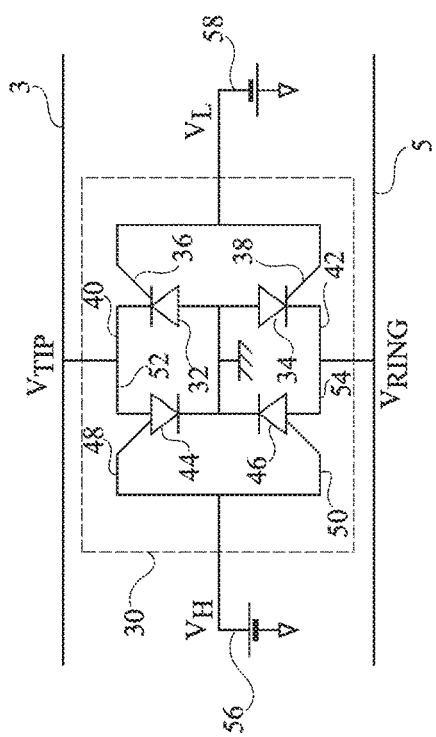
FIG. 2A shows an embodiment of a circuit of protection against overvoltages lower than a negative threshold or higher than a positive threshold, connected to a telephone line.

FIG. 2A shows an embodiment of a circuit of protection against overvoltages lower than a negative threshold or higher than a positive threshold, connected to a telephone line, on the SLIC side. The two conductors 3 and 5 of the line, at voltages $V_{TIP}$ and $V_{RING}$, are connected to a protection structure 30. Structure 30 comprises two cathode-gate thyristors 32, 34 having gates 36 and 38, and having their anodes connected to ground GND. Cathode 40 of thyristor 32 is connected to conductor 3 and cathode 42 of thyristor 34 is connected to conductor 5. Structure 30 also comprises two anode-gate thyristors 44 and 46, having gates 48 and 50, and having their cathodes connected to ground GND. Anode 52 of thyristor 44 is connected to conductor 3, and anode 54 of thyristor 46 is connected to conductor 5.

A positive potential $V_H$ is supplied by a voltage source 56 and a negative potential $V_L$ is supplied by a voltage source 58. Each voltage source may supply or absorb a current while maintaining its potential at a value close to $V_H$ or $V_L$. Gates 36 and 38 of the cathode-gate thyristors are directly connected to voltage source 58 and gates 48 and 50 of the anode-gate thyristors are directly connected to voltage source 56. Voltage sources 56 and 58 may possibly be power supply sources of the SLIC, for example, batteries or stabilized D.C. power supplies.

All thyristors are deprived of emitter short-circuits, that is, in each of the thyristors, the metallization area corresponding to the main electrode on the gate side is in contact, by its entire surface, with the corresponding semiconductor region, and is not in partial contact with the layer having the gate connected thereto.

In normal operation, the voltages of conductors 3 and 5 remain between $V_L$ and $V_H$ and the thyristors are off.

If a negative overvoltage, more negative than $V_L$, occurs on conductor 3, the voltage of cathode 40 becomes lower than gate voltage 36. A current flows from gate 36 to cathode 40. Thyristor 32 having no emitter short-circuit, it is highly sensitive and turns on rapidly, which enables to discharge the overvoltage to ground.

At the end of the overvoltage, first thyristor 32 is still on, and conducts a current flowing from the ground to conductor 3. Since the thyristor comprises no emitter short-circuits, its hold current is low. Thus, the current which flows through thyristor normally remains higher than its hold current. However, since the thyristor gate is maintained at potential $V_L$, lower than the cathode potential, part of the current originating from the ground is deviated towards voltage source 58 instead of flowing towards the cathode, which turns off the thyristor. In other words, the charges present in the gate layer during the thyristor conduction are absorbed by voltage source 58. Since the charges are no longer available to maintain the thyristor on, the latter turns off. This operation is possible since voltage source 58 is a real voltage source capable of maintaining potential $V_L$ while absorbing part of the current. This operation would be impossible if potential $V_L$ was defined, for example, by a Zener diode as described in the two above-mentioned patents.

In the case of a negative overvoltage, more negative than potential $V_L$, on line 5, the operation is identical and implies cathode-gate thyristor 34.

In the case of a positive overvoltage greater than $V_H$ on line 3 or 5, the operation is similar, and implies the corresponding anode-gate thyristor 44 or 46.

In the foregoing, it should be understood that the comparisons of the overvoltages with potential values may be to within a forward diode voltage drop.

Figure 2B:
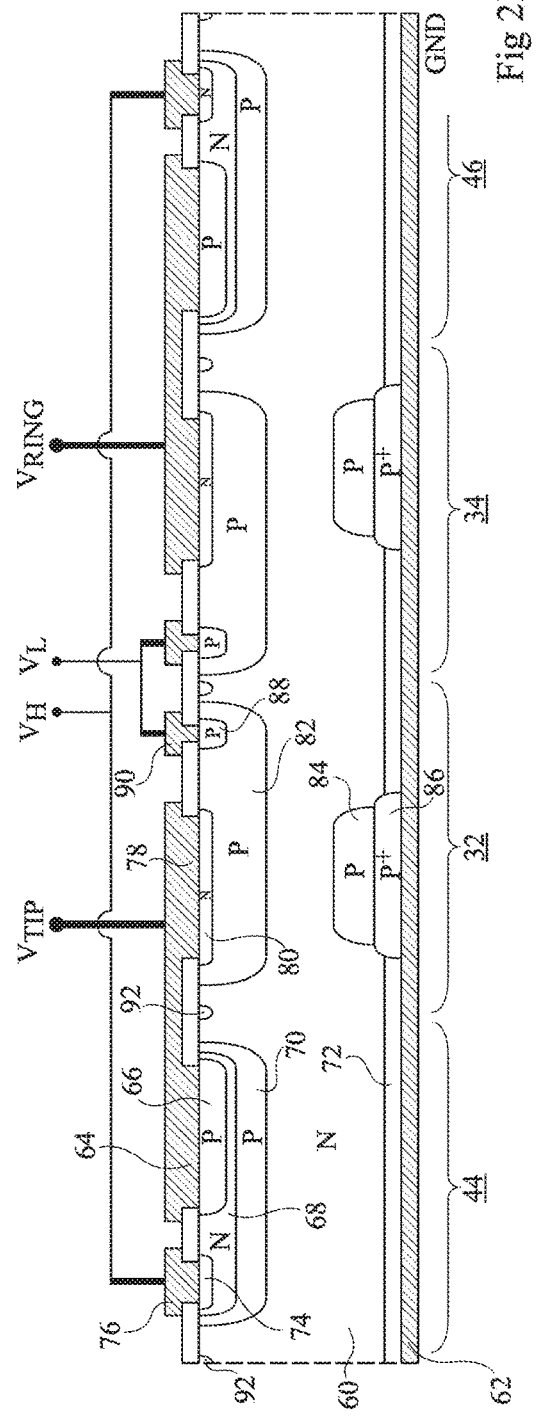
FIG. 2B is a cross-section view of an example of a monolithic component implementing the circuit of FIG. 2A.

FIG. 2B is a cross-section view of an example of a monolithic component using circuit 30 of FIG. 2A. The monolithic component is formed from a lightly-doped N-type semiconductor substrate 60, the semiconductor for example being silicon. The front surface of the component is at the top of the cross-section and the rear surface is at the bottom. The component is divided into two symmetrical portions with respect to the axis of the drawing. The left half contains thyristors 32 and 44, and the right half contains thyristors 34 and 46. Only the left half will be detailed herein, the right half being symmetrical and having an identical operation.

The thyristors have a vertical structure and, at the back of the component, a metallization 62 defines reference potential GND.

Anode-gate thyristor 44 is located between a metallization 64 at the front surface and metallization 62. It comprises a P-type anode region 66 in contact with metallization 64, an N-type gate area 68 with no direct contact with metallization 64 and which contains region 66, a P-type well 70 which contains area 68, a portion of N-type substrate 60, and a heavily-doped N-type cathode layer 72 in contact with metallization 62. The P/N avalanche voltage between anode region 66 and gate area 68 is greater than $V_H$. Gate area 68 is in contact, via a heavily-doped N-type area 74, with a metallization 76.

Cathode-gate thyristor 32 is located between a front surface metallization 78 and metallization 62. It comprises an N-type cathode region 80 in contact with metallization 78, a P-type gate area 82 with no direct contact with metallization 78 and which contains region 80, a portion of N-type substrate 60, a P-type rear surface well 84, in contact with metallization 62 via a heavily-doped P-type anode layer 86. The P/N avalanche voltage between gate area 82 and cathode region 80 is greater than $V_L$. Gate area 82 is in contact, via a heavily-doped P-type area 88, with a metallization 90. Conventionally, the component comprises channel stop regions 92.

Metallizations 64 and 78 are intended to be connected together to conductor 3 ($V_{TIP}$).

Gate metallization 76 of thyristor 44 is intended to be in direct contact with voltage source 56 of potential $V_H$. Gate metallization 90 of thyristor 32 is intended to be in direct contact with voltage source 58 of potential $V_L$.

Figure 3A:
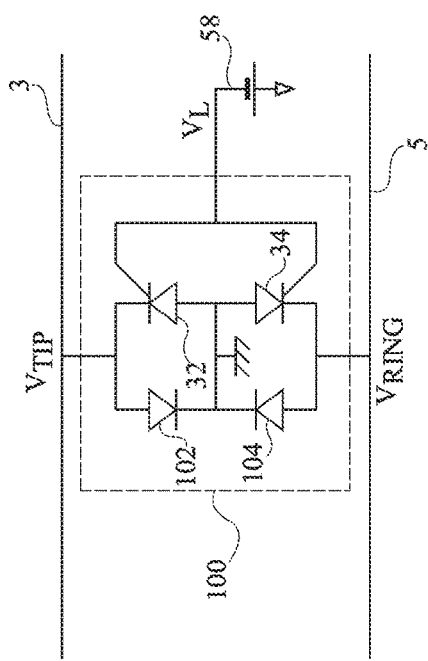
FIG. 3A shows a structure of protection against overvoltages lower than a negative threshold or higher than zero, connected to a telephone line, according to another embodiment.

FIG. 3A shows another embodiment of a protection structure adapted to the cases where the positive threshold is zero, that is, at the potential of ground GND, to within the forward diode voltage drop. The two conductors 3 and 5 of the telephone line are connected to a protection structure 100. Negative potential $V_L$ is supplied by a voltage source 58. Structure 100 comprises thyristors 32 and 34, connected in the same way as in previously-described protection structure 30. Structure 100 also comprises diodes 102 and 104 having their anodes respectively connected to conductors 3 and 5, and their cathodes connected to ground GND.

In case of a negative overvoltage, the operation of protection structure 100 is similar to that of protection structure 30 of FIG. 2A. In case of a positive overvoltage on conductor 3, greater than the forward voltage drop of a PN junction, the overvoltage is deviated to ground through diode 102. The operation is similar with diode 104 in case of a positive overvoltage on conductor 5.

Figure 3B:
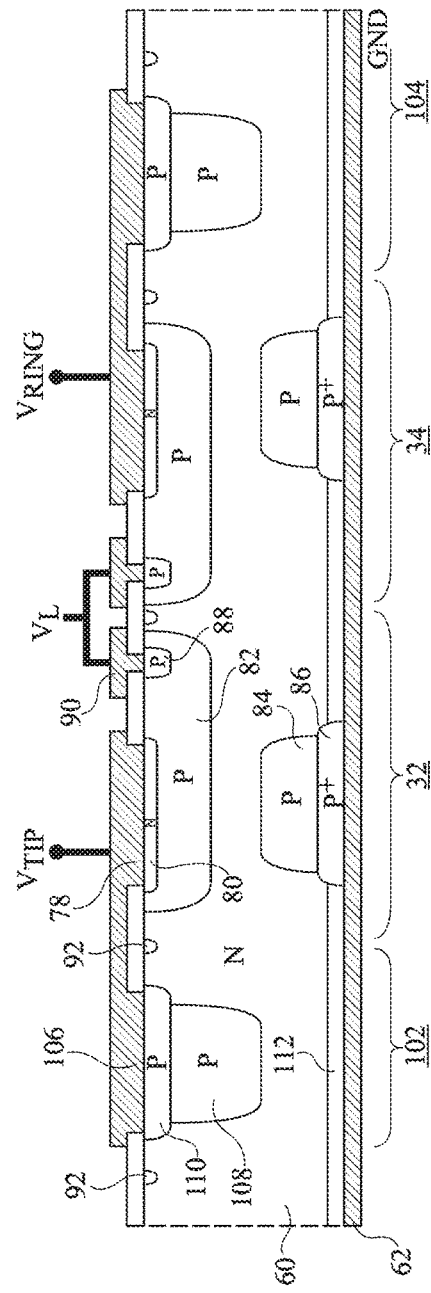
FIG. 3B is a cross-section view of an example of a monolithic component implementing the circuit of FIG. 3A.

FIG. 3B is a cross-section view of an example of a monolithic component using the circuit of FIG. 3A. The component is symmetrical with respect to the axis of the drawing, and only the left-hand portion will be described. This component is formed from a lightly-doped N-type substrate 60, provided with a rear surface metallization 62. The left-hand portion comprises diode 102 and thyristor 32, and the right-hand portion comprises diode 104 and thyristor 34. Thyristors 32 and 34 are formed as described in FIG. 2B. Diode 102 is formed between a front surface metallization 106 and metallization 62, its anode area corresponds to a P-type well 108, in contact with metallization 106 via a heavily-doped P-type layer 110, its cathode area corresponds to a portion of substrate 60 and to a heavily-doped N-type layer 112. Metallization 106 is in contact with metallization 78 and is intended to be connected to conductor 3.

An advantage of the protection structures described herein, where the thyristors have no emitter short-circuits, is that the operation requires no transistor, which enables to decrease the component surface area, and no external components (diodes or transistors), which decreases the cost and the bulk.

Another advantage is that thyristors comprising no emitter short-circuits are highly sensitive, which allows a fast start and thus improves the quality of the protection.

Further, the characteristics of the thyristors may be selected independently from the maximum current capable of flowing through the telephone line. Thus, telephone lines having different characteristics may be protected by protection structures having the same characteristics.

Specific embodiments have been described. Various alterations, modifications, and improvements will occur to those skilled in the art. In particular, although the forming of the monolithic components has been described from an N-type substrate, it should be clear to those skilled in the art that they may be formed from P-type substrates.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A structure for protecting a first line and a second line against overvoltages lower than a negative threshold or higher than a positive threshold, comprising:
    at least one thyristor connected between each of the first and second lines and a reference potential;
    wherein, for all thyristors:
        a metallization corresponding to an electrode on a gate side, wherein that metallization is in contact, by its entire surface, with a surface of a corresponding semiconductor region; and
        the gate is directly connected to a voltage source providing a DC voltage defining one of said negative and positive thresholds.

2. The structure of claim 1, wherein the positive threshold is zero, comprising:
    each of the first and second lines is coupled to the anode of a diode and to the cathode of a cathode-gate thyristor, and cathodes of the diodes and the anodes of the thyristors are coupled to the reference potential;
    a common negative DC voltage source connected to the two gates of the cathode-gate thyristors.

3. The structure of claim 2, wherein the cathode-gate thyristors and the diodes are formed in a same monolithic component.

4. The structure of claim 1, wherein:
    each of the first and second lines is connected to the cathode of a cathode-gate thyristor and to the anode of an anode-gate thyristor, the anodes of the cathode-gate thyristors and the cathodes of the anode-gate thyristors being coupled to the reference potential;
    the gates of the cathode-gate thyristors are directly connected to a common negative DC voltage source defining the negative threshold; and
    the gates of the anode-gate thyristors are directly connected to a common positive DC voltage source defining the positive threshold.

5. The structure of claim 4, wherein all thyristors are formed in a same monolithic component.

6. The structure of claim 1, wherein at least one of the voltage sources is a power supply source of a Subscriber Line Interface Circuit (SLIC) for the first and second lines.

7. The structure of claim 1, wherein at least one of the voltage sources comprises at least one battery.

8. A structure for protecting a first line and a second line against overvoltages lower than a negative threshold or higher than a positive threshold, comprising:
    at least one thyristor connected between each of the first and second lines and a reference potential;
    wherein:
        all thyristors have no emitter short circuits; and
        all thyristors have a semiconductor gate region maintained at one of a negative and positive DC potential by a gate electrode.

9. The structure of claim 8, wherein the positive threshold is zero, comprising:
    each of the first and second lines is coupled to the anode of a diode and to the cathode of a cathode-gate thyristor, and cathodes of the diodes and the anodes of the thyristors are coupled to the reference potential;

a common negative potential is maintained at the two gates of the cathode-gate thyristors.

10. The structure of claim 8, wherein the positive threshold is zero, comprising:
   each of the first and second lines is coupled to the anode of a diode and to the cathode of a cathode-gate thyristor, and cathodes of the diodes and the anodes of the thyristors are coupled to the reference potential;
   a common negative potential is maintained at the two gates of the cathode-gate thyristors.

11. The structure of claim 8, wherein the at least one thyristor is:
   conductive when the voltage between one of the first and second line and the reference potential is greater than one of the positive DC potential and negative DC potential; and
   non-conductive when the voltage between one of the first and second line and the reference potential is less than one of the positive DC potential and negative DC potential.

\* \* \* \* \*